US010059585B2

United States Patent
Pickett et al.

(10) Patent No.: US 10,059,585 B2
(45) Date of Patent: Aug. 28, 2018

(54) FORMATION OF 2D FLAKES FROM CHEMICAL CUTTING OF PREFABRICATED NANOPARTICLES AND VAN DER WAALS HETEROSTRUCTURE DEVICES MADE USING THE SAME

(71) Applicant: Nanoco Technologies Ltd., Manchester (GB)

(72) Inventors: Nigel Pickett, Manchester (GB); Steven Daniels, Manchester (GB); Ombretta Masala, Manchester (GB)

(73) Assignee: Nanoco Technologies Ltd., Manchester (GB)

(*) Notice: Subject to any disclaimer, the term of this patent is extended or adjusted under 35 U.S.C. 154(b) by 0 days.

(21) Appl. No.: 15/631,323

(22) Filed: Jun. 23, 2017

(65) Prior Publication Data

US 2018/0009676 A1    Jan. 11, 2018

Related U.S. Application Data

(60) Provisional application No. 62/355,428, filed on Jun. 28, 2016, provisional application No. 62/461,613, filed on Feb. 21, 2017.

(51) Int. Cl.
*B82Y 40/00* (2011.01)
*C01G 39/06* (2006.01)
(Continued)

(52) U.S. Cl.
CPC .............. *B82Y 40/00* (2013.01); *B01J 13/00* (2013.01); *C01G 39/06* (2013.01); *C09D 11/037* (2013.01); *C09D 11/322* (2013.01); *C09D 11/52* (2013.01); *H01L 31/032* (2013.01); *H01L 31/03845* (2013.01); *H01L 31/18* (2013.01);
(Continued)

(58) Field of Classification Search
None
See application file for complete search history.

(56) References Cited

U.S. PATENT DOCUMENTS

| 7,588,828 B2 | 9/2009 | Mushtaq et al. |
| 2003/0072874 A1 | 4/2003 | Klabunde et al. |
| 2011/0241229 A1 | 10/2011 | Naasani et al. |

FOREIGN PATENT DOCUMENTS

| WO | 2013052541 A2 | 4/2013 |
| WO | 2013093631 A2 | 6/2013 |

OTHER PUBLICATIONS

Han, Han, et al. "ZnO Nanoplates Assembled by Rod-like Nanoparticles: Simple Reflux Synthesis, Influential Factors and Shape Evolution towards Nanorings." RSC Advances, vol. 5, No. 64, 2015, pp. 51750-51761., doi:10.1039/c5ra06203a.*

(Continued)

*Primary Examiner* — Joseph Schoenholtz
(74) *Attorney, Agent, or Firm* — Blank Rome, LLP

(57) ABSTRACT

A method of synthesis of two-dimensional (2D) nanoflakes comprises the cutting of prefabricated nanoparticles. The method allows high control over the shape, size and composition of the 2D nanoflakes, and can be used to produce material with uniform properties in large quantities. Van der Waals heterostructure devices are prepared by fabricating nanoparticles, chemically cutting the nanoparticles to form nanoflakes, dispersing the nanoflakes in a solvent to form an ink, and depositing the ink to form a thin film.

21 Claims, 7 Drawing Sheets

(51) Int. Cl.
- H01L 31/18 (2006.01)
- H01L 31/0384 (2006.01)
- H01L 31/032 (2006.01)
- C09D 11/037 (2014.01)
- C09D 11/52 (2014.01)
- B01J 13/00 (2006.01)
- B82Y 20/00 (2011.01)
- C09D 11/322 (2014.01)

(52) U.S. Cl.
CPC ........... B82Y 20/00 (2013.01); C01P 2004/24 (2013.01); C01P 2006/40 (2013.01); Y10S 977/759 (2013.01); Y10S 977/825 (2013.01); Y10S 977/888 (2013.01); Y10S 977/954 (2013.01)

(56) References Cited

OTHER PUBLICATIONS

Jeong, Sohee, et al. "Tandem Intercalation Strategy for Single-Layer Nanosheets as an Effective Alternative to Conventional Exfoliation Processes." Nature Communications, vol. 6, Sep. 2015, p. 5763., doi:10.1038/ncomms6763.*

Li, Xiao, and Hongwei Zhu. "Two-Dimensional MoS2: Properties, Preparation, and Applications." Journal of Materiomics, vol. 1, No. 1, 2015, pp. 33-44., doi:10.1016/j.jmat.2015.03.003.*

Zhao, Weijie, et al. "Evolution of Electronic Structure in Atomically Thin Sheets of WS2 and WSe2." ACS Nano, vol. 7, No. 1, 2012, pp. 791-797., doi:10.1021/nn305275h.*

Miro, Pere, et al. "Hexagonal Transition-Metal Chalcogenide Nanoflakes with Pronounced Lateral Quantum Confinement." Angewandte Chemie International Edition, Nov. 2014, doi:10.1002/anie.201404704.*

Sun, Y., et al., (2003), "Transformation of Silver Nanospheres into Nanobelts and Triangular Nanoplates through a Thermal Process", Nano Letters, vol. 3, No. 5, pp. 675-679.

Anas, S., et al., (2012), "New insights on physico-chemical transformations of ZnO: From clustered multipods to single crystalline nanoplates", Materials Chemistry and Physics, vol. 134, pp. 435-442.

Zhang, L., et al., (2014), "Fluorographene nanosheets enhanced hydrogen absorption and desorption performances of magnesium hydride", International Journal of Hydrogen Energy, vol. 39, No. 24, pp. 12715-12726.

Kumar, G.G., et al., (2015), "Cobaltite oxide nanosheets anchored graphene nanocomposite as an efficient oxygen reduction reaction (ORR) catalyst for the application of lithium-air batteries", Journal of Power Sources, vol. 288, No. 9, pp. 451-460.

Fang, Liu, et al., (2012), "Magnetic graphene nanosheets based electrochemiluminescence immunoassay of cancer biomarker using CdTe quantum dots coated silica nanospheres as labels", Talanta, vol. 99, pp. 512-519.

K.S. Novoselov, A.K. Geim, S.V. Morozov, D. Jiang, Y. Zhang, S.V. Dubnos, I.V. Grigorieva and A.A. Firsov, Science, 2004, 306, 666.

K.S. Novoselov, A. Mishchenko, A. Carvalho and A.H. Castro Neto, Science, 2016, 353, 461.

F. Withers, H. Yang, L. Britnell, A.P. Rooney, E. Lewis, C.R. Woods, V. Sanchez Romeguera, T. Georgiou, A. Eckmann, Y.J. Kim, S.G. Yeates, S.J. Haigh, A.K. Geim, K.S. Novoselov and C. Casiraghi, Nano Lett., 2014, 14, 3987.

M. Müller, C. Kübel and K. Müllen, Chem.-Eur. J., 1998, 4, 2099.

X. Zong, Y. Na, F. Wen, G. Ma, J. Yang, D. Wang, Y. Ma, M. Wang, L. Sun and C. Li, Chem. Commun., 2009, 4536.

C.B. Murray, D.J. Norris and M.G. Bawendi, J. Am. Chem. Soc., 1993, 115, 8715.

A.C. Ferrari et al., Nanoscale, 2015, 7, 4598.

V. Stengl and J. Henych, Nanoscale, 2013, 5, 3387.

S. Jeong, D. Yoo, M. Ahn, P. Miró, T. Heine and J. Cheon, Nat. Commun., 2015, 6, 5763.

* cited by examiner

FORMATION OF 2D FLAKES FROM CHEMICAL CUTTING OF PREFABRICATED NANOPARTICLES AND VAN DER WAALS HETEROSTRUCTURE DEVICES MADE USING THE SAME

CROSS-REFERENCE TO RELATED APPLICATIONS

This application is a non-provisional of U.S. Provisional Application Ser. No. 62/355,428, filed Jun. 28, 2016, and U.S. Provisional Application Ser. No. 62/461,613, filed Feb. 21, 2017, the entire contents of which are incorporated herein by reference.

STATEMENT REGARDING FEDERALLY SPONSORED RESEARCH OR DEVELOPMENT

Not Applicable

BACKGROUND OF THE INVENTION

1. Field of the Invention

The present invention generally relates to the synthesis of two-dimensional (2D) materials. More particularly, it relates to a synthetic method that comprises the cutting of prefabricated nanoparticles, and van der Waals heterostructure devices utilizing 2D flakes formed by chemical cutting of prefabricated nanoparticles.

2. Description of the Related Art Including Information Disclosed Under 37 CFR 1.97 and 1.98

The isolation of graphene via the mechanical exfoliation of graphite [K. S. Novoselov, A. K. Geim, S. V. Morozov, D. Jiang, Y. Zhang, S. V. Dubnos, I. V. Grigorieva and A. A. Firsov, Science, 2004, 306, 666] has sparked strong interest in two-dimensional (2D) layered materials. The properties of graphene include exceptional strength, and high electrical and thermal conductivity, while being lightweight, flexible and transparent. This opens up the possibility of a wide array of potential applications, including high speed transistors and sensors, barrier materials, solar cells, batteries, and composites.

Other classes of 2D materials of interest include transition metal dichalcogenide (TMDC) materials, hexagonal boron nitride (h-BN), and those based on Group 14 elements, such as silicene and germanene. The properties of these materials can range from semi-metallic, e.g. $NiTe_2$ and $VSe_2$, to semiconducting, e.g. $WSe_2$ and $MoS_2$, to insulating, e.g. h-BN.

2D nanosheets of TMDC materials are of increasing interest for applications ranging from catalysis to sensing, energy storage and optoelectronic devices. Mono- and few-layered TMDCs are direct band gap semiconductors, with variation in band gap and carrier type (n- or p-type) depending on composition, structure and dimensionality.

Of the 2D TMDCs, the semiconductors $WSe_2$ and $MoS_2$ are of particular interest because, while largely preserving their bulk properties, additional properties arise due to quantum confinement effects when the dimensions of the materials are reduced to mono- or few layers. In the case of $WSe_2$ and $MoS_2$, these include the exhibition of an indirect-to-direct band gap transition, with strong excitonic effects, when the thickness is reduced to a single monolayer. This leads to a strong enhancement in photoluminescence efficiency, opening up new opportunities for the application of such materials in optoelectronic devices. Further, when the lateral dimensions of the materials are reduced on the nanoscale, they undergo a "size quantization" effect, whereby the newly instated band gap of the material changes and thus the optical, electronic and chemical properties of the material can be manipulated simply by changing the material's overall dimensions. Other materials of interest include $WS_2$ and $MoSe_2$.

Group 4 to 7 TMDCs predominantly crystallize in layered structures, leading to anisotropy in their electrical, chemical, mechanical and thermal properties. Each layer comprises a hexagonally packed layer of metal atoms sandwiched between two layers of chalcogen atoms via covalent bonds. Neighboring layers are weakly bound by van der Waals interactions, which may easily be broken by mechanical or chemical methods to create mono- and few-layer structures.

The lattice structure of 2D h-BN is similar to that of graphene. Due to its insulating properties, potential applications of h-BN include devices operating at high temperatures in oxidative environments and in insulating composites. Another use of h-BN is as an electrically insulating substrate that is perfectly lattice-matched to graphene.

The graphene analogues of silicon (silicene), germanium (germanene) and tin (stanene) have recently been investigated. One of the potential advantages of silicene is its compatibility with current silicon technology, enabling it to be applied to existing circuits and devices without additional processing steps. Germanene has potential applications in field-effect transistors, while theoretical studies suggest that stanene could find use in nanoelectronics.

For high-performance applications, flat, defect-free material is required, whereas for applications in batteries and supercapacitors, defects, voids and cavities are desirable.

Mono- and few-layer 2D materials can be produced using "top-down" and "bottom-up" approaches. Top-down approaches involve the removal of layers, either mechanically or chemically, from the bulk material. Such techniques include mechanical exfoliation, ultrasound-assisted liquid-phase exfoliation (LPE), and intercalation techniques. Bottom-up approaches, wherein layers are grown from their constituent elements, include chemical vapor deposition (CVD), atomic layer deposition (ALD), and molecular beam epitaxy (MBE), as well as solution-based approaches including hot-injection methods.

Monolayer and few-layer sheets of 2D materials can be produced in small quantities via the mechanical peeling of layers of the bulk solid (the so-called the "Scotch tape method") to produce uncharged sheets that interact through van der Waals forces only. Mechanical exfoliation may be used to yield highly crystalline layers on the order of millimeters, with size being limited by the single crystal grains of the starting material. However, the technique is low-yielding, not scalable and provides poor thickness control. Since the technique produces flakes of different sizes and thicknesses, optical identification must be used to locate the desired atomically thin flakes. As such, the technique is best suited to the production of 2D flakes for the demonstration of high-performance devices and condensed matter phenomena.

2D materials may be exfoliated in liquids by exploiting ultrasounds to extract single layers. The LPE process usually involves three steps: i) dispersion of bulk material in a solvent; ii) exfoliation; and, iii) purification. The purification step is necessary to separate the exfoliated flakes from the un-exfoliated flakes and usually requires ultracentrifugation.

Ultrasound-assisted exfoliation is controlled by the formation, growth and implosive collapse of bubbles or voids in liquids due to pressure fluctuations. Sonication is used to disrupt the weak van der Waals forces between sheets to create few- and single-layer 2D flakes from bulk material. Despite the advantages offered by LPE in terms of scalability, challenges of the process include thickness control, poor reaction yields, and the production being limited to small flakes.

Silicene, germanene and stanene are not known to form bulk layered structures, therefore monolayers of these materials cannot be isolated using exfoliation techniques.

Large area scalability, uniformity and thickness control are routinely achieved for 2D materials using CVD. However, drawbacks include difficulty in maintaining uniform growth and wastefulness due to large amounts of unreacted precursors.

Solution-based approaches for the formation of 2D flakes are highly desirable, as they may offer control over the size, shape and uniformity of the resulting materials, as well as enabling ligands to be applied to the surface of the materials to provide solubility and, thus, solution processability. The application of organic ligands to the surface of the materials may also limit the degradation, as observed for CVD-grown samples, by acting as a barrier to oxygen and other foreign species. The resulting materials are free-standing, further facilitating their processability. However, the solution-based methods thus far developed do not provide a scalable reaction to generate 2D layered materials with the desired crystallographic phase, tunable narrow shape and size distributions and a volatile capping ligand, which is desirable so that it can be easily removed during device processing.

One of the challenges in the production of 2D layered materials is to achieve compositional uniformity, whether high quality defect-free or defect-containing material is required, on a large scale. Further challenges include forming 2D flakes with a homogeneous shape and size distribution.

Layered combinations of different 2D materials are generally called van der Waals heterostructures.

Van der Waals heterostructure devices have been investigated for a wide range of applications, from tunneling devices, to photovoltaic devices and light-emitting diodes. Different types of devices are formed by stacking different combinations of 2D materials with differing properties. Van der Waals heterostructure devices were originally formed by mechanically assembling stacks—a slow and cumbersome process. [K. S. Novoselov, A. Mishchenko, A. Carvalho and A. H. Castro Neto, *Science*, 2016, 353, 461] An early method was based on preparing a 2D flake on a sacrificial membrane, aligning it and placing it on another flake, then removing the membrane. The process can be repeated to deposit further layers. Newer techniques have been developed, including the transfer of large-area crystals grown by CVD, the direct growth of heterostructures by CVD or physical epitaxy, and one-step growth in solution. Solution processing of 2D heterostructure devices is particularly attractive, as it offers a low cost, scalable deposition process.

In the prior art, solution-processed van der Waals heterostructure devices have relied on liquid-phase exfoliated 2D nanoflakes. For example, Withers et al. have described the solution processing of 2D heterostructure devices using 2D flakes formed by LPE of the corresponding bulk materials. [F. Withers, H. Yang, L. Britnell, A. P. Rooney, E. Lewis, C. R. Woods, V. Sanchez Romeguera, T. Georgiou, A. Eckmann, Y. J. Kim, S. G. Yeates, S. J. Haigh, A. K. Geim, K. S. Novoselov and C. Casiraghi, *Nano Lett.*, 2014, 14, 3987].

Heterostructures were created by depositing inks of graphene, TMDCs and hexagonal boron nitride (h-BN) via drop-casting, inkjet printing, and vacuum filtration. The study demonstrated that van der Waals heterostructure devices could be produced from solution-processed 2D materials. However, LPE of bulk powders can result in a broad size distribution of nanoflakes. Methods to selectively isolate nanosheets of similar size have been developed, but this process is highly wasteful of material. Moreover, reaction yields from LPE processes are typically poor.

Thus, there is a need for a synthesis method that produces uniform 2D materials in high yield.

BRIEF SUMMARY OF THE INVENTION

Herein, a "bottom-up-top down" method of forming 2D layered materials is disclosed. The method comprises forming three-dimensional (3D) or zero-dimensional (0D) nanoparticles of a desired shape, size and composition, followed by treatment, such as chemical treatment, e.g. reflux, liquid phase exfoliation (LPE) and reflux, or intercalation and exfoliation, to form 2D nanoflakes of uniform size as dictated by the intrinsic shape of the 3D or 0D nanoparticles. The process is scalable and can be used to produce 2D nanoflakes with uniform properties in large volumes.

By controlling the shape of the prefabricated nanoparticles, the method offers control over the shape and size distribution of the resulting 2D nanoflakes. The shape of prefabricated nanoparticles may include, but is not restricted to, spherical, nanorods, nanowires, nanotubes, tetrapods, nanocubes, etc.

By controlling the chemical composition of the prefabricated nanoparticles, the method offers control over the chemical composition of the 2D nanoflakes. For example, the method can be used to form nanoflakes with uniform levels of doping, with a graded composition, and/or with a core/shell structure.

In one embodiment, the nanoparticles are fabricated via a colloidal method of synthesis, allowing control over their shape, size and composition, and may offer scalability.

In one embodiment, the nanoparticles are quantum dots (QD). The cutting of QDs may be used to form 2D quantum dots (2D QDs), including single-layer QDs.

In one embodiment, the cutting of the prefabricated nanoparticles to 2D nanoflakes comprises the steps of LPE and/or reflux.

In one embodiment, the cutting of the prefabricated nanoparticles to 2D nanoflakes comprises the steps of intercalation and exfoliation.

It has been found that a van der Waals heterostructure device may be prepared by fabricating nanoparticles, chemically cutting the nanoparticles to form nanoflakes, dispersing the nanoflakes in a solvent to form an ink, and depositing the ink to form a thin film.

BRIEF DESCRIPTION OF THE SEVERAL VIEWS OF THE DRAWING(S)

DETAILED DESCRIPTION OF THE INVENTION

Herein, a "bottom-up-top down" method of forming 2D layered materials is disclosed. The method comprises forming 3D or 0D nanoparticles of a desired shape, size and composition, followed by treatment, such as chemical treatment, e.g. reflux, LPE and reflux, or intercalation and exfoliation, to form 2D nanoflakes of uniform size as dictated by the intrinsic shape of the 3D or 0D nanoparticles. The process is scalable and can be used to produce 2D nanoflakes with uniform properties in large volumes.

As used herein, the "cutting" of a nanoparticle means the separation of the nanoparticle into two or more parts. The term is not intended to imply any restriction on the method of separation, and can include physical and chemical methods of separation. Physical separation methods may include, but are not restricted to: mechanical exfoliation (the so-called "Scotch tape method"), delamination, grinding, and milling. As used herein, the "chemical cutting" of a nanoparticle means the separation of the nanoparticle into two or more parts, wherein the separation is effected by a chemical treatment. In certain embodiments, a chemical treatment may include: the application of heat, pressure, vacuum, ultrasonication, and/or agitation to a solution or dispersion of nanoparticles; chemical etching; and intercalation. Non-limiting examples of chemical cutting methods include: refluxing the nanoparticles in solution; LPE of the nanoparticles followed by reflux; or intercalation and exfoliation of the nanoparticles.

As used herein, the term "nanoparticle" is used to describe a particle with dimensions on the order of approximately 1 to 100 nm. The term "quantum dot" (QD) is used to describe a semiconductor nanoparticle displaying quantum confinement effects. The dimensions of QDs are typically, but not exclusively, between 1 to 10 nm. The terms "nanoparticle" and "quantum dot" are not intended to imply any restrictions on the shape of the particle. The term "nanorod" is used to describe a prismatic nanoparticle having lateral dimensions, x and y, and length, z, wherein z>x,y. The term "2D nanoflake" is used to describe a particle with lateral dimensions on the order of approximately 1 to 100 nm and a thickness between 1 to 5 atomic or molecular monolayers.

The method allows control over the shape of the 2D nanoflakes, which is determined by the shape of the prefabricated nanoparticles. Methods to control the shape of nanoparticles during solution-based synthesis are well known in the art, and can include modification of the reaction conditions such as temperature, the use of seeds or templates to mediate nanoparticle growth, or the addition of ligands, surfactants and/or additives to the reaction solution.

Figure 1:
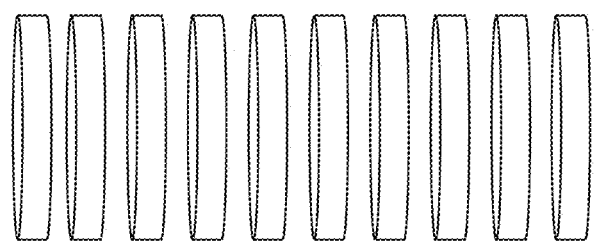
FIG. 1 illustrates the chemical cutting of prefabricated nanorods into nanoflakes.
Figure 1:
Figure 1:
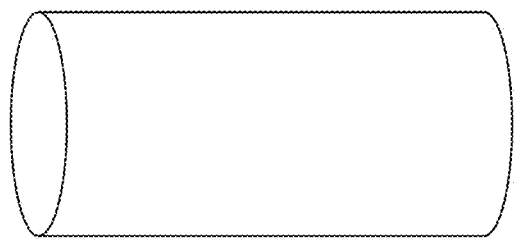
Figure 2:
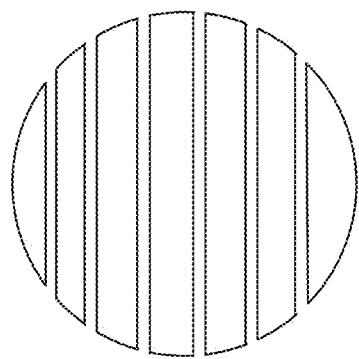
FIG. 2 illustrates the chemical cutting of prefabricated spherical nanoparticles into nanoflakes with a distribution of sizes.
Figure 2:
Figure 2:
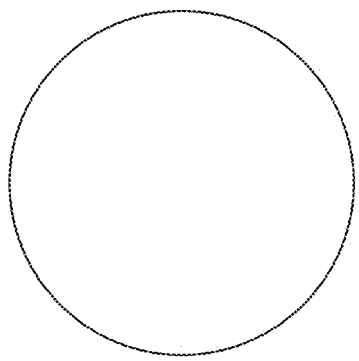

In a further embodiment, the method enables the size distribution of the resultant 2D nanoflakes to be controlled. For example, the chemical cutting of nanorods will lead to the formation of an ensemble of round 2D nanoflakes of uniform shape and size, as shown in FIG. 1, whereas the chemical cutting of spherical nanoparticles will lead to the formation of an ensemble of round 2D nanoflakes with a uniform shape but with a distribution of sizes, as shown in FIG. 2. An ensemble of different sized 2D nanoflakes may provide properties such as photoluminescence at a number of different wavelengths across a range when the ensemble is excited using monochromatic light. This may be used to generate polychromatic light from an ensemble of 2D nanoflakes cut from a population of spherical nanoparticles of a single size. In an alternative embodiment, where there is an ensemble of different sized nanoflakes, the nanoflakes may subsequently be separated by size using techniques known in the art, including, but not restricted to, high speed centrifugation, size-selective precipitation, dialysis, column chromatography, or gel permeation chromatography (GPC).

The shape of the nanoparticles is not limited and can include, but is not restricted to, spherical, nanorods, nanowires, nanotubes, tetrapods, nanocubes, etc. Methods to control the shape of the nanoparticles may include the addition of compounds that will preferentially bind to a specific lattice plane of the growing particle and subsequently inhibit or slow particle growth in a specific direction, as described in U.S. Pat. No. 7,588,828, issued Sep. 15, 2009, which is hereby incorporated by reference in its entirety.

Figure 3:
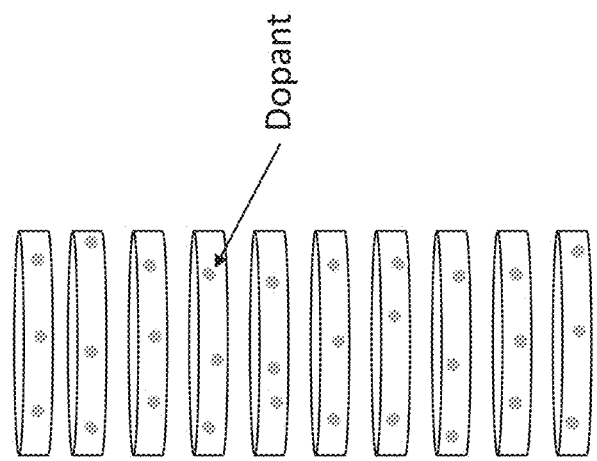
FIG. 3 illustrates the chemical cutting of prefabricated doped nanorods into doped nanoflakes.
Figure 3:
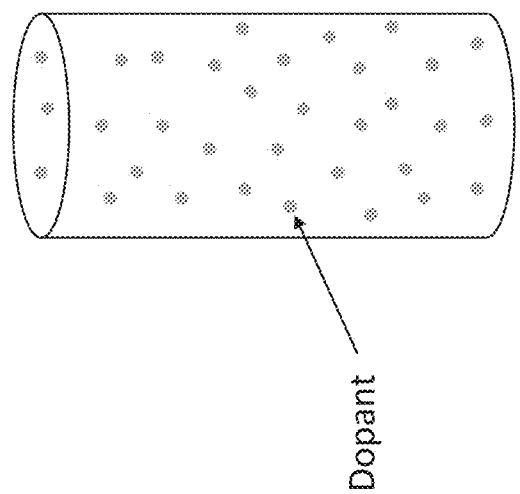

By forming 2D nanoflakes from nanoparticles, methods according to the present disclosure enable the chemical composition of a 2D material to be controlled. For example, methods to introduce dopants into nanoparticles are used herein to introduce dopant atoms into 2D nanoflakes. By chemically cutting uniformly doped nanoparticles, the resultant 2D nanoflakes have a uniform level of doping, as illustrated in FIG. 3.

The composition of the nanoparticles is unrestricted. Suitable materials include, but are not restricted to:

Graphene, graphene oxide and reduced graphene oxide;

transition metal dichalcogenides (TMDCs) such as, for example, $WO_2$; $WS_2$; $WSe_2$; $WTe_2$; $MnO_2$; $MoO_2$; $MoS_2$; $MoSe_2$; $MoTe_2$; $NiO_2$; $NiTe_2$; $NiSe_2$; $VO_2$; $VS_2$; $VSe_2$; $TaS_2$; $TaSe_2$; $RuO_2$; $RhTe_2$; $PdTe_2$; $HfS_2$; $NbS_2$; $NbSe_2$; $NbTe_2$; $FeS_2$; $TiO_2$; $TiS_2$; $TiSe_2$; and $ZrS_2$;

transition metal trichalcogenides such as, for example, $TaO_3$; $MnO_3$; $WO_3$; $ZrS_3$; $ZrSe_3$; $HfS_3$; and $HfSe_3$;

Group 13-16 (III-VI) compounds such as, for example, InS; InSe; GaS; GaSe; and GaTe;

Group 15-16 (IV-VI) compounds such as, for example, $Bi_2Se_3$; and $Bi_2Te_3$;

nitrides such as, for example, h-BN;

oxides such as, for example, $LaVO_3$; $LaMnO_3$; $V_2O_5$; $LaNbO_7$; $Ca_2Nb_3O_{10}$; $Ni(OH)_2$; and $Eu(OH)_2$; layered copper oxides; micas; and bismuth strontium calcium copper oxide (BSCCO);

phosphides such as, for example, $Li_7MnP_4$; and $MnP_4$; and 2D allotropes of Group 14 elements such as, for example, silicene; germanene; and stanene. Within the aforementioned materials, adjacent layers are held together by van der Waals interactions, which can readily be broken by techniques such as exfoliation techniques, for example, LPE to form 2D flakes. In alternative embodiments, the nanoparticles comprise non-layered semiconductor materials, including, but not restricted to:

Group 12-16 (II-VI) semiconductors such as, for example, ZnS; ZnSe; CdS; CdSe; CdTe;

Group 13-15 (III-V) materials such as, for example, GaN; GaP; GaAs; InN; InP; InAs; and Group materials such as, for example, CuGaS$_2$; CuGaSe$_2$; CuGa(S,Se)$_2$; CuInS$_2$, CuInSe$_2$; CuIn(S,Se)$_2$; Cu(In,Ga)S$_2$; Cu(In,Ga)Se$_2$; Cu(In,Ga)(S,Se)$_2$; CuInTe$_2$; AgInS$_2$; and AgInSe$_2$; and including doped species and alloys thereof.

In yet further embodiments, the nanoparticles may comprise a metal, such as, but not restricted to: Ag; Au; Cu; Pt; Pd; Ru; and Re, and including doped species and alloys thereof.

Figure 4:
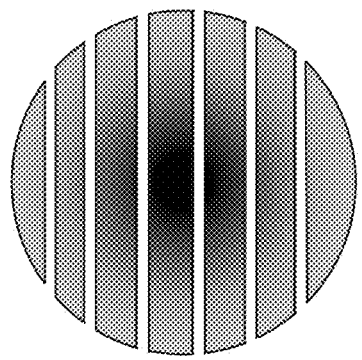
FIG. 4 illustrates the chemical cutting of prefabricated, compositionally graded, spherical nanoparticles into compositionally graded nanoflakes.
Figure 4:
Figure 4:
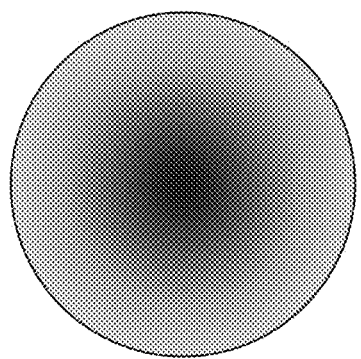

The composition of the nanoparticles may be uniform, or may be graded such that the composition varies from the center across one or more of the planes of the nanoparticle. In the case of a graded spherical nanoparticles, chemical cutting will result in 2D nanoflakes with differing compositions depending on the flake size or region from which the 2D nanoflake is derived from the compositionally graded nanoparticle, as shown in FIG. 4.

In some embodiments, the nanoparticles are QDs. QDs have widely been investigated for their unique optical, electronic and chemical properties, which originate from "quantum confinement effects"; as the dimensions of a semiconductor nanoparticle are reduced below twice the Bohr radius, the energy levels become quantized, giving rise to discrete energy levels. The band gap increases with decreasing particle size, leading to size-tunable optical, electronic and chemical properties, such as size-dependent photoluminescence. Moreover, it has been found that reducing the lateral dimensions of a 2D nanoflake into the quantum confinement regime may give rise to yet further unique properties, depending on both the lateral dimensions and the number of layers of the 2D nanoflake. In some embodiments, the lateral dimensions of the 2D nanoflakes may be in the quantum confinement regime, wherein the optical, electronic and chemical properties of the nanoparticles may be manipulated by changing their lateral dimensions. For example, metal chalcogenide monolayer nanoflakes of materials such as MoSe$_2$ and WSe$_2$ with lateral dimensions of approximately 10 nm or less may display properties such as size-tunable emission when excited. This can enable the electroluminescence maximum ($EL_{max}$) or photoluminescence maximum ($PL_{max}$) of the 2D nanoflakes to be tuned by manipulating the lateral dimensions of the nanoparticles. As used herein, a "2D quantum dot" or "2D QD" refers to a semiconductor nanoparticle with lateral dimensions in the quantum confinement regime and a thickness between 1-5 monolayers. As used herein, a "single-layered quantum dot" or "single-layered QD" refers to a semiconductor nanoparticle with lateral dimensions in the quantum confinement regime and a thickness of a single monolayer. Compared with conventional QDs, 2D QDs have a much higher surface area-to-volume ratio, which decreases as the number of monolayers is decreased. The highest surface area-to-volume ratio is seen for single-layered QDs. This may lead to 2D QDs having very different surface chemistry from conventional QDs, which may be exploited for applications such as catalysis.

Figure 5:
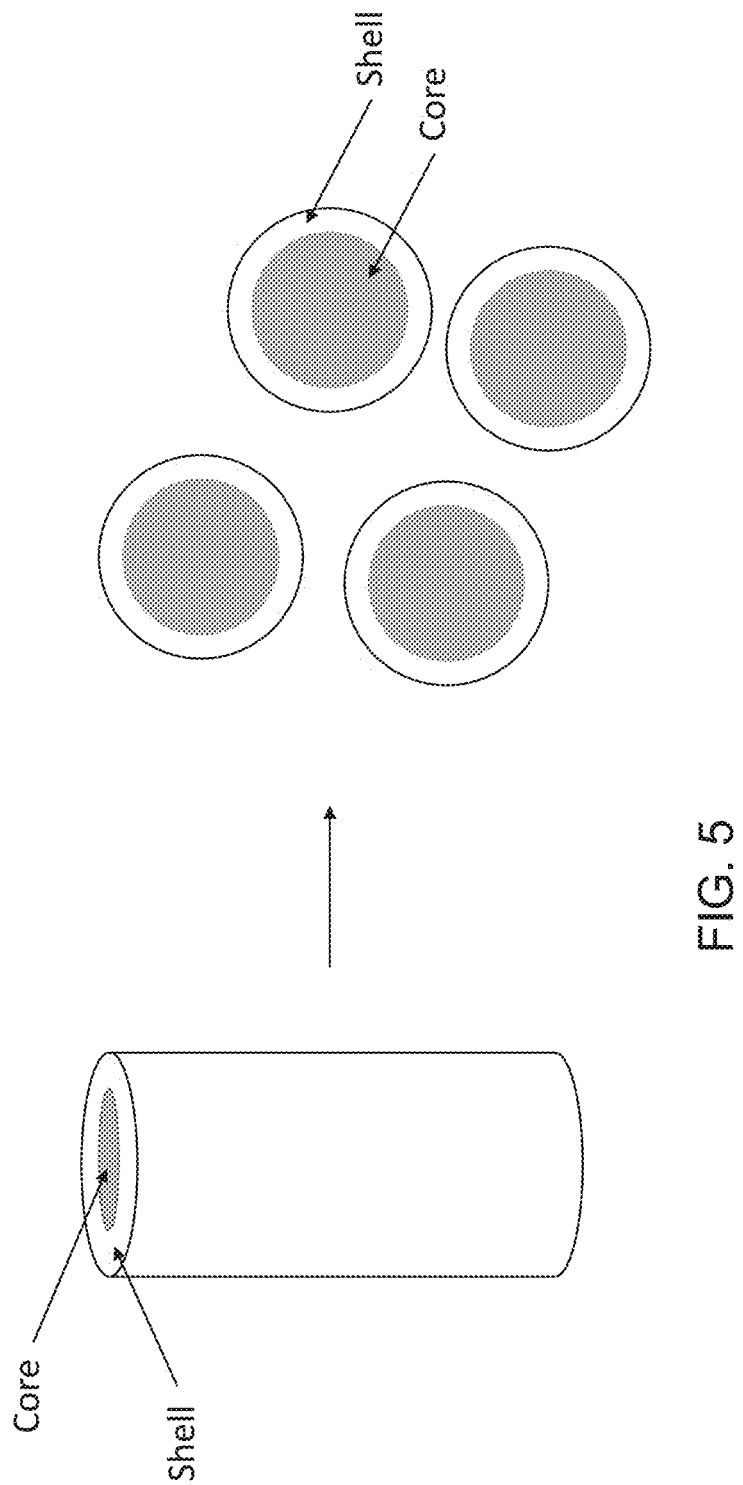
FIG. 5 illustrates the chemical cutting of prefabricated core/shell nanorods into core/shell nanoflakes.

For photoluminescence applications, it is known that growing one or more "shell" layers of a wider band gap semiconductor material with a small lattice mismatch on a semiconductor QD nanoparticle "core" may increase the photoluminescence quantum yield of the nanoparticle material by eliminating defects and dangling bonds located on the core surface. In some embodiments, one or more shell layers of a second material are grown epitaxially on the core nanoparticle material to form a core/shell nanoparticle structure. The core/shell nanoparticle may be cut to form a core/shell 2D nanoflake. As used herein, "core/shell 2D nanoflake" refers to a 2D nanoflake of a first material wherein at least one surface of the first material is at least partially covered by second material. FIG. 5 illustrates the production of core/shell 2D nanoflakes from the chemical cutting of core/shell nanorods.

In alternative embodiments, core/shell 2D nanoflakes may be produced by the chemical cutting of prefabricated core nanoparticles, followed by the formation of one or more shell layers on core nanoflakes.

Colloidal syntheses of nanoparticles are particularly favorable since they allow control over the shape, size and composition of the nanoparticles, and may offer scalability. Colloidal nanoparticles may also be surface-functionalised with ligands (capping agents), where the ligands may be chosen to impart solubility in a range of solvents. Ligands may also be used to control the shape of the resulting nanoparticles. The inherent ligands deposited on the nanoparticle surface during nanoparticle synthesis may be exchanged with alternative ligands to impart a particular function, such as improved solution processability in a particular solvent. For example, a common method of synthesis of graphene QD nanoparticles is based on oxidative condensation reactions developed by Müllen and co-workers. [M. Müller, C. Kübel and K. Müllen, Chem.-Eur. J., 1998, 4, 2099]. The method involves the steps of: i) synthesis of small halogenated phenylacetylene compounds via Suzuki coupling with aryl halides to form larger arylethynylenes; ii) coupling of the arylethynylenes into larger polyphenylene dendrimers via Diels-Alder cycloaddition of tetraphenyl-cyclopentadienone; and, iii) oxidative cyclodehydrogenation of the dendrimers, e.g., by aluminum (III) chloride, to form graphene QDs. The preparation of colloidal MoS$_2$ nanoparticles via a solvothermal route has been described by Zong et al. [X. Zong, Y. Na, F. Wen, G. Ma, J. Yang, D. Wang, Y. Ma, M. Wang, L. Sun and C. Li, Chem. Commun., 2009, 4536]. The nanoparticles were prepared by heating a solution of (NH$_4$)$_2$MoS$_4$ in methanol, poly(vinylpyrrolidone) and hydrazine monohydrate N$_2$H$_4$.H$_2$O, in a Teflon-lined, stainless steel autoclave. Other methods of colloidal nanoparticle synthesis such as dual injection [C. B. Murray, D. J. Norris and M. G. Bawendi, J. Am. Chem. Soc., 1993, 115, 8715] or molecular seeding processes [U.S. Pat. No. 7,588,828] may be used.

In one embodiment, the nanoparticles are grown using a bottom-up approach in a colloidal solution.

According to certain embodiments, the nanoparticles are isolated from the colloidal reaction solution prior to cutting. Isolation techniques can include, but are not limited to, centrifugation or filtration.

The cutting of the prefabricated nanoparticles into nanoflakes can be performed using any suitable technique. Suitable examples include chemical and physical exfoliation processes. In one embodiment, the cutting of the prefabricated nanoparticles is performed by a chemical method, such as LPE, which comprises the ultrasonication of the prefabricated nanoparticles in a solvent. The surface tension of the solvent may be chosen to match that of the material being exfoliated. LPE techniques have been reviewed by Ferrari et al., [A. C. Ferrari et al., Nanoscale, 2015, 7, 4598] which is hereby incorporated by reference in its entirety. In some embodiments, the exfoliated nanoparticles are subsequently refluxed in solution. The refluxing of exfoliated MoS$_2$ nanosheets to form MoS$_2$ QDs has been described by Stengl and Henych. [V. Stengl and J. Henych, Nanoscale, 2013, 5, 3387].

In some embodiments, the cutting of prefabricated nanoparticles may be carried out by refluxing the prefabricated nanoparticles in solution without prior exfoliation. One of ordinary skill in the art will recognize that the temperature at which the prefabricated nanoparticle solution is refluxed will depend on the boiling point of the solvent in which the solution is formed. Without wishing to be bound by any particular theory, one possible mechanism is that the application of heat may thermally expand the layers within the nanoparticles; refluxing the solution may form a gas which chemically cuts the layers apart. In some embodiments, the solution comprises a coordinating solvent. Examples of suitable coordinating solvents include, but are not restricted to: saturated alkyl amines such as, for example, $C_6$-$C_{50}$ alkyl amines; unsaturated fatty amines such as, for example, oleylamine; fatty acids such as, for example, myristic acid, palmitic acid, and oleic acid; phosphines such as, for example, trioctylphosphine (TOP); phosphine oxides such as, for example, trioctylphosphine oxide (TOPO); alcohols such as, for example hexadecanol, benzylalcohol, ethylene glycol, propylene glycol; and may include primary, secondary, tertiary and branched solvents. In some embodiments, the solution comprises a non-coordinating solvent, such as, but not restricted to, a $C_{11}$-$C_{50}$ alkane. In some embodiments, the boiling point of the solvent is between 150° C. to 600° C., for example, 160° C. to 400° C., or more particularly 180° C. to 360° C. In a particular embodiment, the solvent is hexadecylamine.

In yet further embodiments, the cutting of prefabricated nanoparticles is performed by an intercalation and exfoliation process. Intercalation and exfoliation of TMDC multi-layered nanostructures using Lewis base intercalates, has previously been described by Jeong et al. [S. Jeong, D. Yoo, M. Ahn, P. Miró, T. Heine and J. Cheon, *Nat. Commun.,* 2015, 6, 5763]. A first intercalation and exfoliation process may be carried out by stirring the prefabricated nanoparticles in a first solvent in the presence of a first intercalating agent and a second intercalating agent for a first time period. Optionally, a second solvent may subsequently be added, followed by stirring for a second time period. In some embodiments, a second intercalation and exfoliation process is carried out by mixing the product of a first intercalation and exfoliation process with a third intercalating agent and a third solvent and stirring for a third time period. Optionally, a fourth solvent may subsequently be added, followed by stirring for a fourth time period. The first intercalating agent and the second intercalating agent may comprise hydrocarbons wherein the hydrocarbon chain length of the first intercalating agent is different to the hydrocarbon chain length of the second intercalating agent. The third intercalating agent may be the same or different from the first and/or second intercalating agent. Suitable first, second and third intercalating agents may include, but are not restricted to:

Lewis bases, such as amines such as, for example, propylamine, hexylamine; alkoxides such as, for example, sodium methoxide, sodium ethoxide; carboxylates such as, for example, sodium hexanoate; and amino alcohols such as, for example, 3-amino-1-propanol;

aminothiols such as, for example, cysteamine, 6-amino-1-hexanethiol, and 8-amino-1-octanethiol; and amino acids, including alkyl amino acids, such as, for example, 3-aminopropanoic acid (β-alanine), 6-aminohexanoic acid, 8-aminooctanoic acid;

One of ordinary skill in the art will recognize that the choice of solvent(s) in which the intercalation and exfoliation process is carried out will depend on the choice of nanoparticles and intercalating agents. During intercalation and exfoliation, it is desirable that the nanoparticles are well dispersed or dissolved in the solvent(s). It is further desirable that the intercalating agent(s) are soluble in the solvent(s). The second solvent may be different from the first solvent. The third solvent may be the same as the first solvent or the second solvent, or may be different from both the first solvent and the second solvent. Suitable solvents include, but are not restricted to: polar aprotic solvents such as, for example, dimethyl sulfoxide (DMSO), and acetonitrile; and polar protic solvents such as, for example, propanol.

The first time period may be in the range 1 hour to 1 month, for example, 2 hours to 2 weeks, or more particularly 4 hours to 3 days. The second time period may be in the range 1 hour to 2 months, for example, 2 days to 2 weeks, or more particularly 1 week to 3 weeks. The third time period may be in the range 1 hour to 1 month, for example, 2 hours to 2 weeks, or more particularly 4 hours to 3 days. The fourth time period may be in the range 1 hour to 2 months, for example, 2 days to 2 weeks, or more particularly 1 week to 3 weeks. However, one of ordinary skill in the art will recognize that the time period will depend on factors such as the choice of solvent(s) and intercalating agent(s), the strength of the bonding within the nanoparticles, and the concentration of nanoparticles to intercalating agents in solution, and that a longer time period may lead to a higher yield of 2D nanoflakes.

In some embodiments, the first and/or second and/or subsequent intercalation and exfoliation processes may be effected using ultrasonication. Using ultrasonication in the place of stirring may facilitate a reduction in the time period(s) required to effect the chemical cutting process.

Other cutting techniques can be used for the cutting of the prefabricated nanoparticles to 2D nanoflakes, such as, but not restricted to, etching techniques. According to certain embodiments, the 2D nanoflakes may then be isolated from solution by techniques such as, but not limited to: centrifugation; filtration; dialysis or column chromatography. The resulting 2D nanoflakes may be dispersed in a solvent to form an ink that may be deposited to form a thin film using conventional solution-based deposition techniques such as, but not restricted to: drop-casting, spin-coating, slit coating, spray coating, slot die coating, inkjet printing or doctor blading. Inherent uniformity in the properties of the 2D nanoflakes may result in a high degree of uniformity in the resulting thin film. The film thickness may be controlled by, for example, altering the concentration of the ink and/or by changing the size of the 2D nanoflakes.

Examples of van der Waals heterostructure devices that may be prepared utilizing a 2D nanoflake-containing ink include: waveguide integrated few-layer black phosphorus photodetectors; $MoS_2$ vertical homojunction photodiodes; electrostatically defined $WSe_2$ photodiodes; $MoS_2$/$WSe_2$ vertical photodiodes; GaS flexible phototransistors; $WS_2$ phototransistors; $MoS_2$ phototransistors; $O_2$ plasma treatment-enhanced $ReS_2$ phototransistors; plasmon-enhanced $MoS_2$ photodetectors; $MoS_2$/Si heterojunction photodiodes; graphene/$MoS_2$/graphene vertical photodiodes; graphene/$MoS_2$ hybrid phototransistors; and, graphene/QD hybrid phototransistors.

EXAMPLES

Example 1: Preparation of $MoS_2$ Nanoparticles, Chemical Cutting and Van Der Waals Heterostructure Device Formation Synthesis of $MoS_2$ Nanoparticles Synthesis was carried out under an inert $N_2$ environment.

0.132 g Mo(CO)$_6$ was added to a vial capped with a SUBA-SEAL® rubber septum [SIGMA-ALDRICH CO., LLC, 3050 Spruce Street St. Louis MISSOURI 63103] in a glovebox.

14 g octadecane was degassed for 2 hours at 100° C. in a round-bottom flask, then cooled to room temperature.

2 g hexadecylamine and 2 g octadecane were degassed for 2 hours at 100° C. in a vial, then cooled to 40-50° C. and injected into the vial containing the Mo(CO)$_6$ and shaken well.

The reaction mixture was warmed gently to 150° C. and the vial shaken to dissolve any sublimed Mo(CO)$_6$, then cooled to room temperature to form a Mo(CO)$_6$-amine complex.

The round-bottom flask (containing 14 g octadecane) was then heated to 300° C.

The Mo(CO)$_6$-amine complex was warmed gently to ~40° C. until the solids melted, and 1.5 mL 1-dodecane thiol (DDT) was added. It was then immediately loaded into a syringe and rapidly injected into the round-bottom flask. The temperature was adjusted to ~260° C.

The reaction mixture was left for 8 minutes at 260° C.

To isolate the product, 40 mL propanol mixed with 10 mL acetonitrile were added, centrifuged at 4000 rpm for 5 minutes and the supernatant discarded.

Chemical Cutting of MoS$_2$ Nanoparticles to Form Single-Layered MoS$_2$ Nanoflakes MoS$_2$ nanoparticles (45 mg), sodium methoxide (1.5 g), and sodium hexanoate (0.5 g) were mixed in dimethyl sulfoxide (15 mL) and stirred, under N$_2$, for 18 hours at room temperature. Acetonitrile (140 mL) was added and stirred, under N$_2$, for 48 hours. The supernatant was separated from a black solid by centrifugation at 4000 rpm for 5 minutes.

The black solid was washed with toluene and centrifuged. The solid was then dissolved in water.

Preparation of a Van Der Waals Heterostructure Device Using Single-Layered MoS$_2$ Nanoflakes A van der Waals heterostructure device (LED) was prepared as follows:

Boron nitride on SiO$_2$ and poly(methyl methacrylate) (PMMA) was exfoliated as was graphite on PMMA. Layers of graphene and thin (2-5 layers) boron nitride flakes were selected.

Graphene (Gr) from PMMA was transferred onto boron nitride (BN) on SiO$_2$, and thin boron nitride flakes from PMMA were transferred onto the SiO$_2$/BN/Gr layered structure to produce a second layered structure—SiO$_2$/BN/Gr/BN.

At this stage, the above-described aqueous solution (or dispersion) of single-layered MoS$_2$ nanoflakes was drop cast onto the second layered structure and left to dry. This procedure was repeated twice to increase the amount of MoS$_2$. It was found that the application of heat resulted in a smaller amount of MoS$_2$ in the resulting structure (SiO$_2$/BN/Gr/BN/MoS$_2$) and was therefore avoided.

In the next fabrication stage, BN from SiO$_2$ was picked up using a graphene flake on PMMA and this stack (PMMA/Gr/BN) was transferred onto SiO$_2$/BN/Gr/BN/MoS$_2$, which produced the van der Waals heterostructure (LED) SiO$_2$/BN/Gr/BN/MoS$_2$/BN/Gr.

Graphene flakes may act as conducting electrodes to inject electrons and holes into the MoS$_2$ through tunnel BN barriers.

Example 2: Preparation of MoS$_2$ Nanoparticles and Chemical Cutting

Synthesis of MoS$_2$ Nanoparticles

Synthesis was carried out under an inert N$_2$ environment.

0.132 g Mo(CO)$_6$ was added to a vial capped with a SUBA-SEAL® rubber septum [SIGMA-ALDRICH CO., LLC, 3050 Spruce Street St. Louis MISSOURI 63103] in a glovebox.

14 g octadecane was degassed for 2 hours at 100° C. in a round-bottom flask, then cooled to room temperature.

2 g hexadecylamine and 2 g octadecane were degassed for 2 hours at 100° C. in a vial, then cooled to 40-50° C. and injected into the vial containing the Mo(CO)$_6$ and shaken well.

The reaction mixture was warmed gently to 150° C. and the vial shaken to dissolve any sublimed Mo(CO)$_6$, then cooled to room temperature to form a Mo(CO)$_6$-amine complex.

The round-bottom flask (containing 14 g octadecane) was then heated to 300° C.

The Mo(CO)$_6$-amine complex was warmed gently to ~40° C. until the solids melted, and 1.5 mL 1-dodecane thiol (DDT) was added. It was then immediately loaded into a syringe and rapidly injected into the round-bottom flask. The temperature was adjusted to ~260° C.

The reaction mixture was left for 8 minutes at 260° C.

To isolate the product, acetone (200 mL) was added, centrifuged at 4000 rpm for 5 minutes and the supernatant discarded.

Chemical Cutting of MoS$_2$ Nanoparticles to Form Single-Layered MoS$_2$ Nanoflakes MoS$_2$ nanoparticles (240 mg), sodium methoxide (15 g), and sodium hexanoate (3 g) were mixed in propanol (100 mL) and stirred, under N$_2$, for 1 day at room temperature. Acetonitrile (100 mL) was added and stirred, under N$_2$, for 2 weeks. Insoluble material was separated by centrifugation at 4000 rpm for 5 minutes. The acetonitrile-insoluble material was then dissolved in water.

The supernatant was dried under vacuum using a rotary evaporator. Water (200 mL) was added and mixed well. Toluene (50 mL) was added and the organic phase was collected using a dropping funnel. The aqueous phase was washed further with toluene (3×50 mL) and the organic fractions were combined. The toluene solution was dried using a rotary evaporator and the solid washed once further with water. The solid was then dissolved in methanol.

Example 3: Chemical Cutting of Prefabricated Nanoparticles Via Reflux

MoS$_2$ nanoparticles were prepared as in Example 1. MoS$_2$ nanoparticles (10 mg) were mixed with hexadecylamine (10 g) and heated to 330° C. After refluxing for 15 minutes, the solution was cooled to 60° C. Methanol (60 mL) was added, followed by centrifugation, and a black insoluble material was discarded. The supernatant was dried under vacuum, then acetonitrile was added. The mixture was warmed and the soluble phase was decanted and discarded. The solid was again mixed with acetonitrile, warmed to dissolve excess hexadecylamine, and the soluble phase was decanted and discarded. The process was repeated until the material was clean. The final material was dissolved in toluene.

Example 4: Preparation of MoS$_2$ Nanoparticles and Chemical Cutting

Synthesis of MoS$_2$ Nanoparticles

In a 200 mL vial, hexadecylamine (10 g) and hexadecane (50 mL) were degassed under vacuum at 80° C. The hexadecylamine/hexadecane solution was added to Mo(CO)$_6$ (0.66 g) in a 250 mL round-bottom flask, and stirred at 120° C. to form a solution A.

In a 1 L round-bottom flask, hexadecane (50 mL) and hexadecylamine (5 g) were heated under vacuum at 80° C. for 1 hour. The solution was heated to 250° C., under N$_2$, to form a solution B. At 250° C., 5 mL portions of solution A (maintained at 120° C.) were added to solution B every 5 minutes for 1 hour, to form a solution C.

1-dodecanethiol (7.5 mL) was subsequently added slowly to solution C at 250° C., over 1 hour, using a syringe pump, before stirring for a further hour at 250° C.

The solution was cooled to 60° C., then acetone (400 mL) was added, followed by centrifugation. The residual solids were dispersed in hexane (125 mL).

Chemical Cutting of MoS$_2$ Nanoparticles to Form Single-Layered MoS$_2$ Nanoflakes ⅙$^{th}$ of the dispersion of MoS$_2$ nanoparticles in hexane was combined with 6-aminohexan-1-ol (1.48 g) and propylamine (8.3 mL) in a 250 mL round-bottom flask, and stirred under N$_2$ for 11 days.

Dry acetonitrile (160 mL) was added, then the mixture was stirred under N$_2$ for 6 days.

The mixture was filtered through a 0.20 μm polypropylene syringe filter, resulting in the isolation of the filtrate and solid residues.

To the filtrate, the solvent was vacuum evaporated until an oil was obtained. Dry acetonitrile (6 mL) was added to disperse the solvent-soluble luminescent materials.

To the solid residues, deionized water (30 mL) was added, then the mixture stirred in air for 30 minutes. The resulting solution was filtered through a 0.20 μm polypropylene syringe filter and isolated.

Figures 6A, 6B:
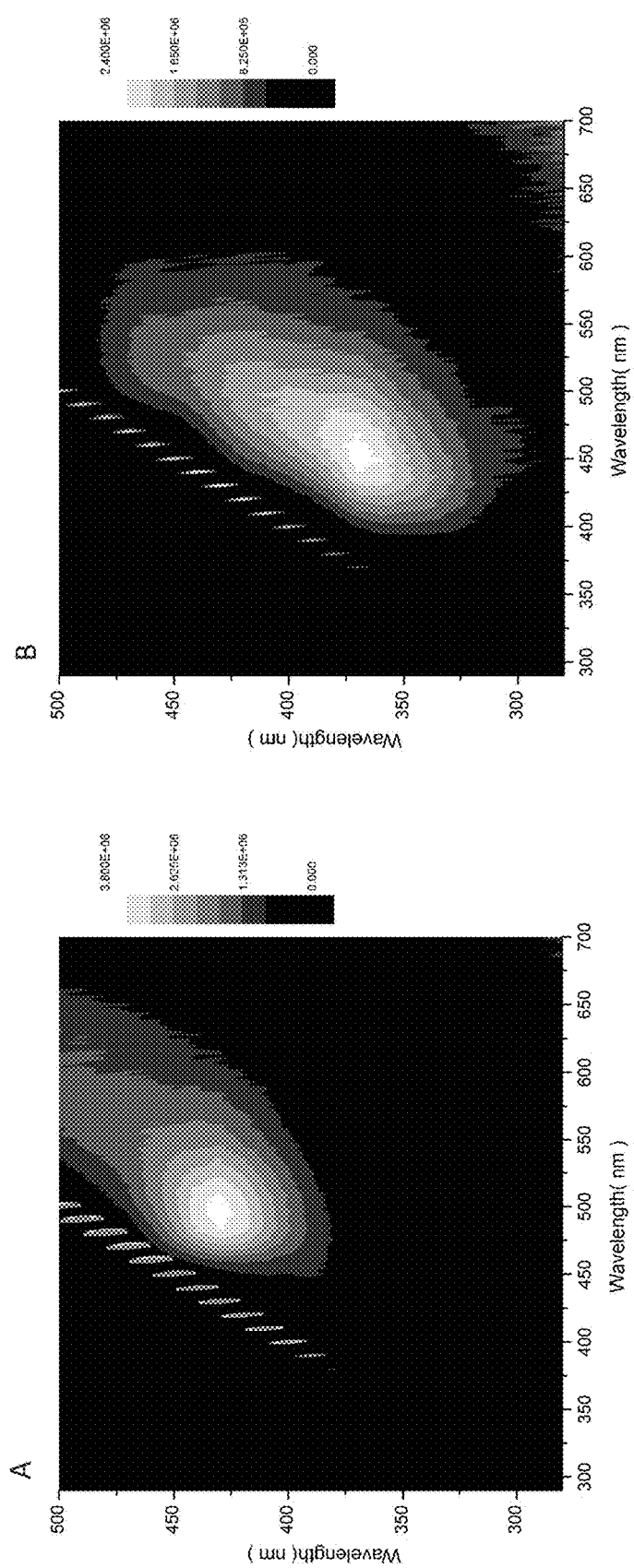
FIG. 6A and FIG. 6B are photoluminescence (PL) contour maps for solutions of 2D nanoflakes produced according to an embodiment of the invention.

The acetonitrile-soluble material and the water-soluble material displayed different emissive properties to one another. FIG. 6A and FIG. 6B show the PL contour map for the acetonitrile-soluble material and the water-soluble material, respectively. The PL contour map show the emission wavelength (x-axis) at a given excitation wavelength (y-axis), with the intensity (in arbitrary units) being represented by the color scale. As shown in FIG. 6A, the acetonitrile-soluble material displays excitation wavelength-dependent emission, with the highest intensity emission being seen at ~500 nm when excited at ~430 nm. As shown in FIG. 6B, the water-soluble material displays excitation wavelength-dependent emission, with the highest intensity emission being seen at ~450 nm when excited at ~370 nm. When excited at the same wavelength, the material dissolved in acetonitrile and the material dissolved in water emit at wavelengths distinct to one another.

Example 5: Preparation of MoS$_2$ Nanoparticles and Chemical Cutting

Synthesis of MoS$_2$ Nanoparticles

MoS$_2$ nanoparticles were prepared as per Example 2.

Chemical Cutting of MoS$_2$ Nanoparticles to form Single-Layered MoS$_2$ Nanoflakes The MoS$_2$ nanoparticles were dissolved in a minimum volume of hexane, then transferred to a round-bottom flask. Myristic acid (10 g) was added and the reaction slowly heated to 110° C. under vacuum.

The vessel was placed under N$_2$ and heated to 330° C. for 50 minutes.

The reaction was cooled to 60° C. Acetone (200 mL) was added, followed by centrifugation. A black material was collected. The supernatant was dried under vacuum using a rotary evaporator.

Figures 7A, 7B:
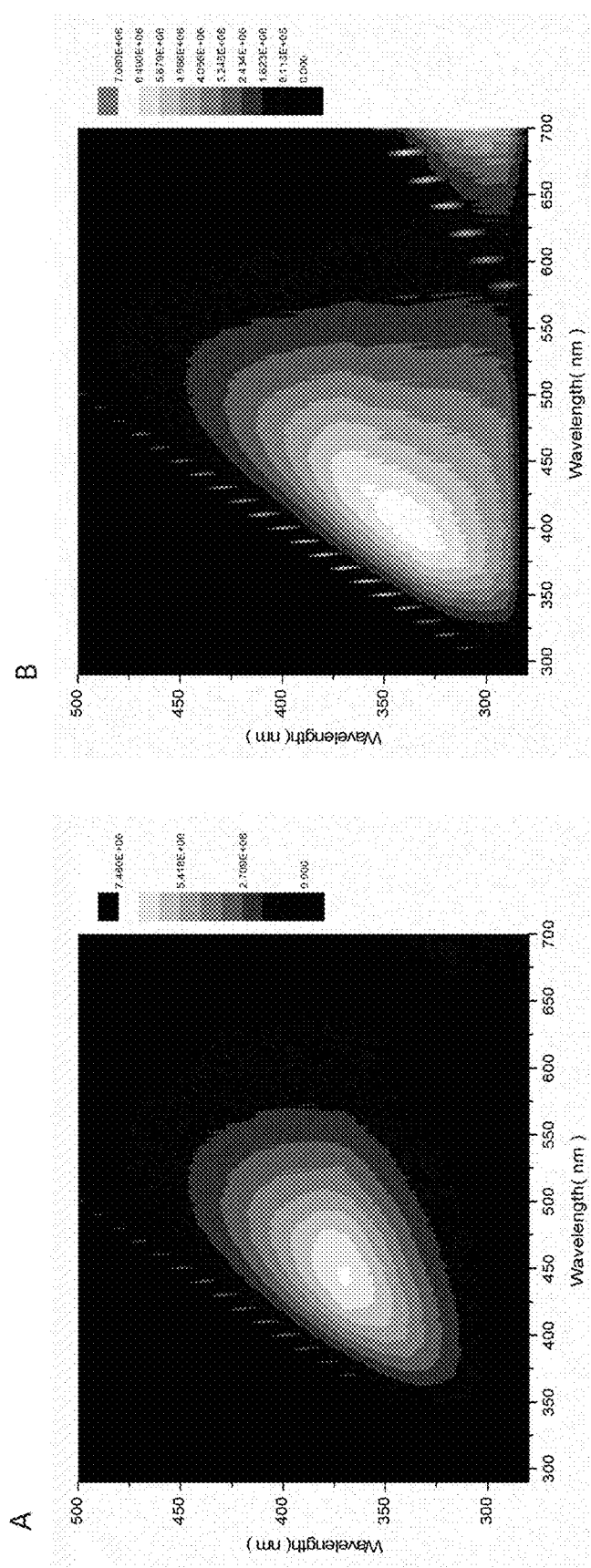
FIG. 7A and FIG. 7B are PL contour maps for solutions of 2D nanoflakes produced according to an embodiment of the invention.

Acetonitrile (200 mL) was added to the dried solid at 25° C. and shaken well. The material was centrifuged and a black solid was combined with the black material previously collected. The supernatant was separated. The supernatant displayed excitation wavelength-dependent emission, with the highest intensity emission being seen at ~440 nm when excited at ~370 nm, as shown in FIG. 7A.

To the combined black solids, acetonitrile (100 mL) was added and warmed while stirring. Some black non-luminescent solid remained undissolved, while the solution developed a deep yellow color that was highly luminescent. The deep yellow solution was separated from the black non-luminescent solid. The deep yellow solution displayed excitation wavelength-dependent emission, with the highest intensity emission being seen at ~405 nm when excited at ~340 nm, as shown in FIG. 7B.

Advantages of using material formed by the chemical cutting of prefabricated nanoparticles include:
- the material has uniform properties (composition, shape, and optionally size), leading to uniformity in the thin films and resulting devices;
- the material is highly soluble, so may be easily processed in a number of solvents to form an ink; and
- the process allows for control over the flake size from the dimensions of the parent nanoparticles.

Further, doped nanoparticles may be chemically cut as a means to introduce uniform doping into the device.

Solution processing offers the advantages of:
- control over the layer thickness and the ability to form uniform layers;
- low deposition cost;
- scalability; and
- applicability to flexible substrates for flexible electronics and photovoltaics.

These and other advantages of the present invention will be apparent to those skilled in the art from the foregoing disclosure. Accordingly, it is to be recognized that changes or modifications may be made to the above-described embodiments without departing from the broad inventive concepts of the invention. It is to be understood that this invention is not limited to the particular embodiments described herein and that various changes and modifications may be made without departing from the scope of the present invention as literally and equivalently covered by the following claims.

What is claimed is:

1. A method of fabricating a two-dimensional nanoflake comprising:
   fabricating a nanoparticle; and
   refluxing the nanoparticle in a solvent to form the two-dimensional nanoflake.

2. The method of claim 1, wherein the solvent is a coordinating solvent.

3. The method of claim 1, wherein the solvent is selected from the group consisting of: amines; fatty acids; phosphines; phosphine oxides; and alcohols.

4. The method of claim 1, wherein the solvent is hexadecylamine or myristic acid.

5. The method of claim 1, wherein the nanoparticle is a quantum dot.

6. The method of claim 1, wherein the nanoparticle is a nanorod.

7. A method of fabricating a two-dimensional nanoflake comprising:
   fabricating a nanoparticle;

stirring the nanoparticle in a first solvent in the presence of a first intercalating agent and a second intercalating agent for a first time period; and adding a second solvent and stirring for a second time period.

8. The method of claim 7, wherein the first and second intercalating agents are selected from the group consisting of: Lewis bases; aminothiols; and amino acids.

9. The method of claim 7, wherein the first and second solvents are selected from the group consisting of: dimethyl sulfoxide; acetonitrile; and propanol.

10. The method of claim 7, further comprising:
adding a third intercalating agent and a third solvent; and stirring for a third time period.

11. The method of claim 7, wherein the nanoparticle is a quantum dot.

12. The method of claim 7, wherein the nanoparticle is a nanorod.

13. A method of preparing a van der Waals heterostructure device comprising:
fabricating nanoparticles;
chemical cutting of the nanoparticles to form two-dimensional nanoflakes;
dispersing the nanoflakes in a solvent to form an ink; and
depositing the ink to form a thin film.

14. The method of claim 13, wherein the nanoparticles are selected from the group consisting of: graphene; transition metal dichalcogenides; transition metal trichalcogenides; Group 13-16 compounds; Group 15-16 compounds; hexagonal boron nitride; oxides; phosphides; Group 14 elements; Group 12-16 compounds; Group 13-15 compounds; I-III-VI compounds; and metals; and their doped derivatives and alloys.

15. The method of claim 13, wherein the nanoparticles are $MoS_2$ nanoparticles.

16. The method of claim 13, wherein the nanoparticles are quantum dots.

17. The method of claim 13, wherein the nanoparticles are nanorods.

18. A method of fabricating two-dimensional nanoflakes, the method comprising:
fabricating a nanoparticle; and
refluxing the nanoparticle in a solvent to convert the nanoparticle into a plurality of two-dimensional nanoflakes.

19. The method of claim 18, wherein the nanoparticle is a 3D nanoparticle.

20. The method of claim 18, wherein the nanoparticle is a 0D nanoparticle.

21. The method of claim 18, wherein the nanoparticle is a nanorod.

* * * * *